United States Patent
Norouzpourshirazi et al.

(10) Patent No.: US 12,132,493 B2
(45) Date of Patent: Oct. 29, 2024

(54) DATA-DEPENDENT GLITCH AND INTER-SYMBOL INTERFERENCE MINIMIZATION IN SWITCHED-CAPACITOR CIRCUITS

(71) Applicant: Cirrus Logic International Semiconductor Ltd., Edinburgh (GB)

(72) Inventors: Arashk Norouzpourshirazi, Austin, TX (US); Ramin Zanbaghi, Austin, TX (US); Stephen T. Hodapp, Austin, TX (US); Christophe J. Amadi, Austin, TX (US); Ravi K. Kummaraguntla, Austin, TX (US); Dhrubajyoti Dutta, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 127 days.

(21) Appl. No.: 17/952,863

(22) Filed: Sep. 26, 2022

(65) Prior Publication Data

US 2024/0106448 A1 Mar. 28, 2024

(51) Int. Cl.
*H03M 1/06* (2006.01)

(52) U.S. Cl.
CPC ................................. *H03M 1/0617* (2013.01)

(58) Field of Classification Search
CPC . H03M 1/0617; H03M 1/1245; H03M 1/0863
See application file for complete search history.

(56) References Cited

U.S. PATENT DOCUMENTS

| 2011/0095930 A1 | 4/2011 | Buter et al. |
| 2014/0333465 A1* | 11/2014 | Elsayed ............ H03M 1/0845 341/172 |

FOREIGN PATENT DOCUMENTS

WO    2011036529 A2    3/2011

OTHER PUBLICATIONS

Combined Search and Examination Report under Sections 17 and 18(3), UKIPO, Application No. GB2311895.3, dated Jan. 30, 2024.

* cited by examiner

*Primary Examiner* — Jean B Jeanglaude
(74) *Attorney, Agent, or Firm* — Jackson Walker L.L.P.

(57) ABSTRACT

A system may include a sampling capacitor and a switch network. The switch network may include one or more first sampling switches electrically coupled to the sampling capacitor and configured to be activated during a first phase of a sampling cycle of the system and one or more second sampling switches electrically coupled to the sampling capacitor and configured to be activated during a second phase of the sampling cycle, wherein the switch network is configured to reset the sampling capacitor to a data-independent and/or signal-independent charge during a reset phase of the sampling cycle.

18 Claims, 8 Drawing Sheets

DATA-DEPENDENT GLITCH AND INTER-SYMBOL INTERFERENCE MINIMIZATION IN SWITCHED-CAPACITOR CIRCUITS

FIELD OF DISCLOSURE

The present disclosure relates in general to methods and systems for minimizing data-dependent glitch and inter-symbol interference in a switched-capacitor circuit, such as in a reference digital-to-analog converter (DAC) of an analog-to-digital converter (ADC).

BACKGROUND

Delta-sigma modulators are typically used in electronic circuits such as analog-to-digital converters (ADCs). Often, such ADCs employ an antialiasing filter to filter an analog input signal that may be sampled by a sampling network at the input of the delta-sigma modulator for conversion into an equivalent digital signal by the ADC. An example of such a sampling network is a switched capacitor circuit.

An ADC may also include a reference digital-to-analog converter (DAC) having a sampling network for sampling a reference voltage. Generally speaking, an ADC may convert analog input that varies from zero volts up to the reference voltage. The reference voltage thus defines a ceiling in terms of the input signal an ADC can convert, and is essentially the yardstick against which every proportion and result is measured.

In some instances, an ADC may employ a double-sampled reference DAC in which the reference voltage is sampled during both phases of a sampling cycle in order to maximize reference charge to an integrator of the ADC. Despite such advantages, double-sampled reference DACs may be problematic when the same reference voltage is shared among a plurality of ADCs. For example, a double-sampled reference DAC may kick back residual charge onto the reference voltage, resulting in an image of the quantization noise of the double-sampled reference DAC onto the reference voltage. Tones resulting from this kickback may propagate through the shared reference voltage to the output of other ADCs sharing the reference voltage. Such tones may also be multiplied into ADC from which the kickback occurs.

SUMMARY

In accordance with the teachings of the present disclosure, the disadvantages and problems associated with existing approaches for implementing switched-capacitor circuits may be reduced or eliminated.

In accordance with embodiments of the present disclosure, a system may include a sampling capacitor and a switch network. The switch network may include one or more first sampling switches electrically coupled to the sampling capacitor and configured to be activated during a first phase of a sampling cycle of the system and one or more second sampling switches electrically coupled to the sampling capacitor and configured to be activated during a second phase of the sampling cycle, wherein the switch network is configured to reset the sampling capacitor to a data-independent and/or signal-independent charge during a reset phase of the sampling cycle.

In accordance with these and other embodiments of the present disclosure, a method may include, in a system comprising a sampling capacitor and a switch network comprising one or more first sampling switches electrically coupled to the sampling capacitor and one or more second sampling switches electrically coupled to the sampling capacitor: activating the one or more first sampling switches during a first phase of a sampling cycle of the system, activating the one or more second sampling switches during a second phase of the sampling cycle, and resetting the sampling capacitor to a data-independent and/or signal-independent charge during a reset phase of the sampling cycle.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Figure 1:
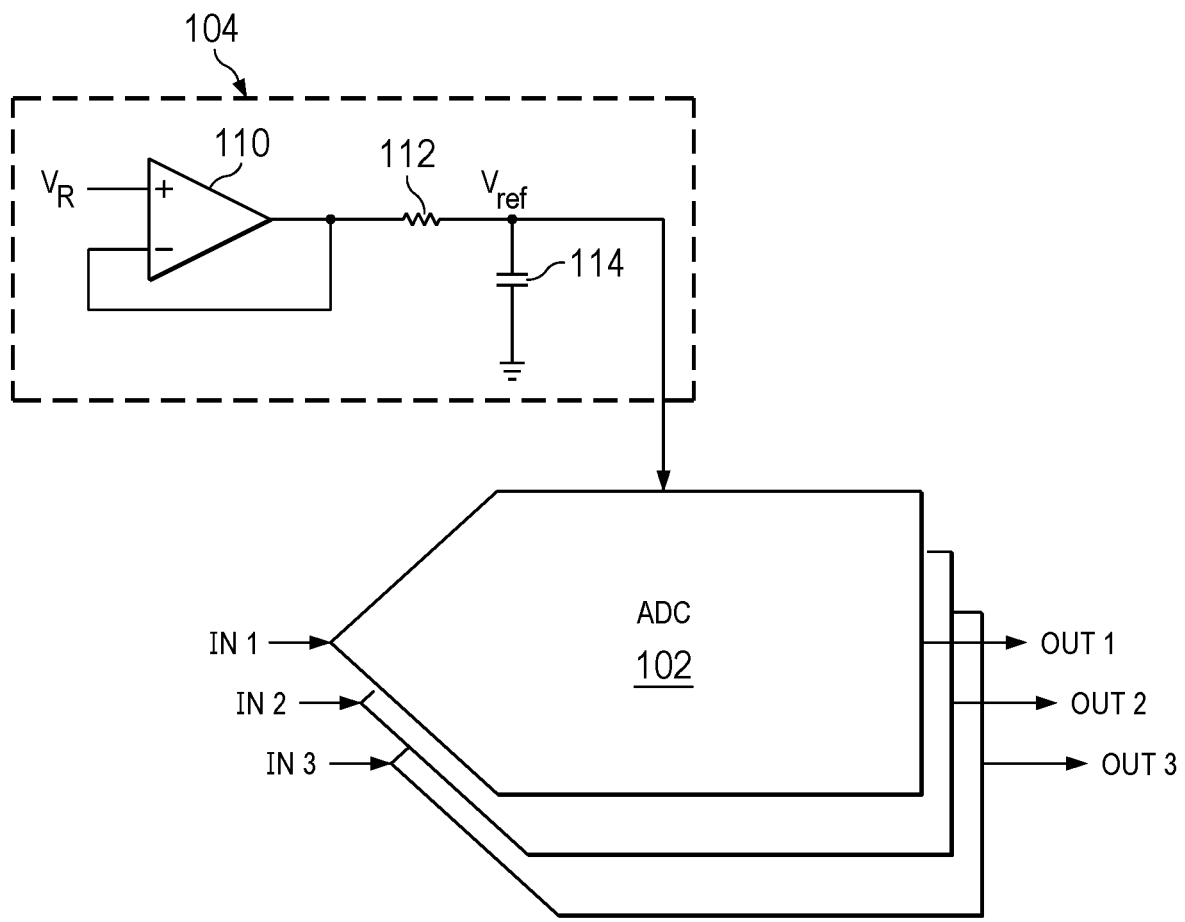
FIG. 1 illustrates a circuit diagram of a plurality of ADCs and a reference generation circuit for generating a shared reference voltage for the plurality of ADCs, in accordance with embodiments of the present disclosure.

FIG. 1 illustrates a circuit diagram of a plurality of ADCs 102 and a reference generation circuit 104 for generating a shared reference voltage $V_{ref}$ for the plurality of ADCs 102, in accordance with embodiments of the present disclosure.

An ADC 102 may comprise any suitable system, device, or apparatus configured to receive an analog signal (e.g., IN1, IN2, IN3) and convert such analog signal into an equivalent digital signal (e.g., OUT1, OUT2, OUT3). An ADC 102 may include numerous components, including without limitation a loop filter, a delta-sigma modulator, a quantizer, and a reference DAC having a sampling network for sampling reference voltage $V_{REF}$. In some embodiments, a reference DAC may include a double-sampling reference DAC with the sampling network configured to sample reference voltage $V_{REF}$ during both phases of a sampling cycle, as described in greater detail below.

Reference generation circuit 104 may comprise any suitable system, device, or apparatus configured to generate shared reference voltage $V_{REF}$ for the plurality of ADCs 102. For example, as shown in FIG. 1, reference generation circuit 104 may include an operational amplifier 110 and low-pass filter comprising filter resistor 112 and filter capacitor 114 for conditioning a raw reference voltage signal Y R to generate reference voltage $V_{REF}$. Although, for purposes of clarity and exposition, FIG. 1 depicts reference generation circuit 104 as generating reference voltage $V_{REF}$ for three ADCs 102, it is understood that reference generation circuit 104 may generate reference voltage $V_{REF}$ for any suitable number of ADCs 102.

Figure 2:
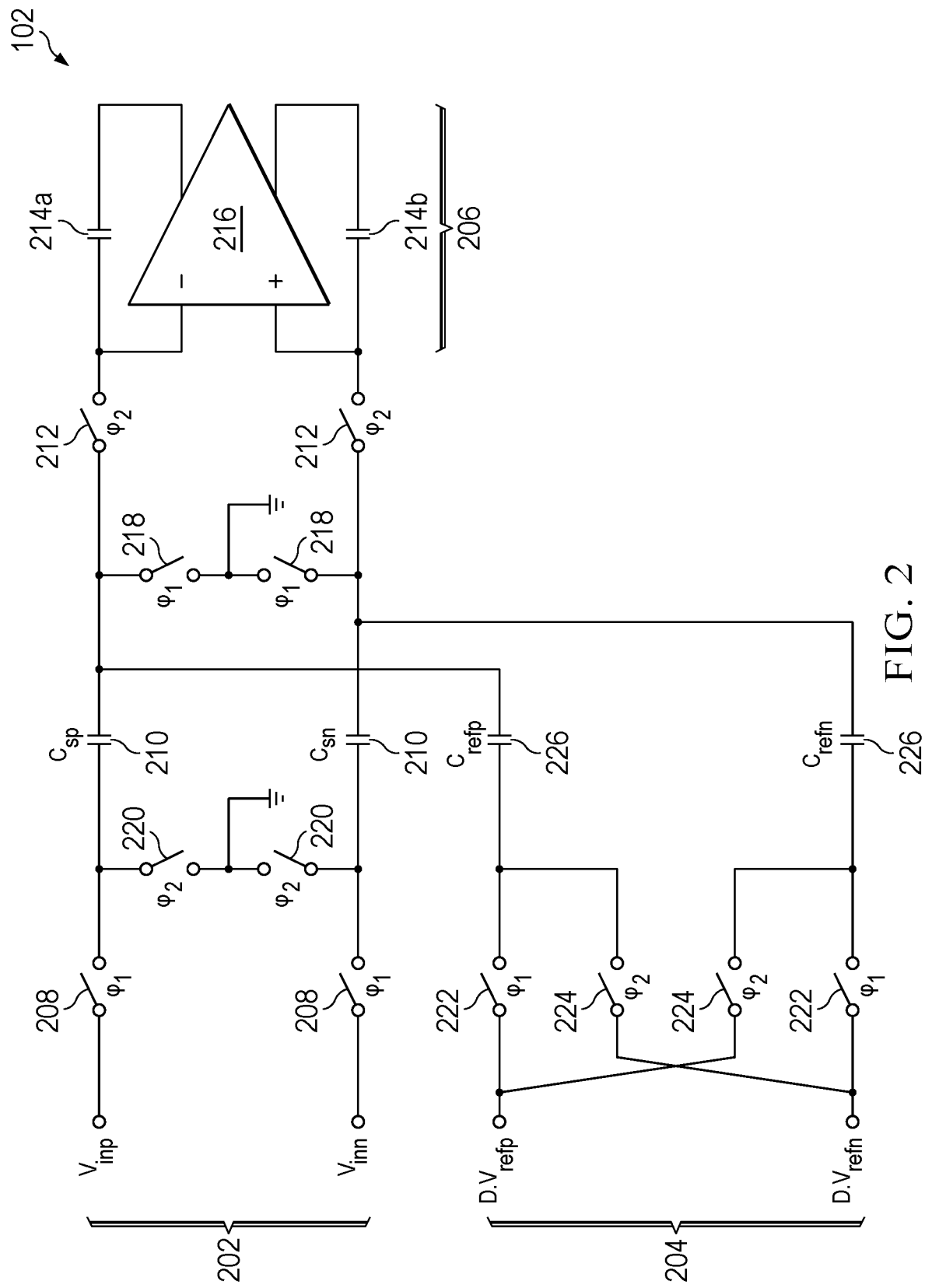
FIG. 2 illustrates a circuit diagram of selected components of an example ADC using a switched-capacitor circuit for double sampling, in accordance with embodiments of the present disclosure.

FIG. 2 illustrates a circuit diagram of selected components of an example ADC 102 using a switched-capacitor circuit for double sampling, in accordance with embodiments of the present disclosure. As shown in FIG. 2, ADC 102 may include an input sampling network 202, a reference sampling network 204, and an integrator 206. ADC 102 may include other components, but only selected components are shown for purposes of clarity and exposition.

Figure 4:
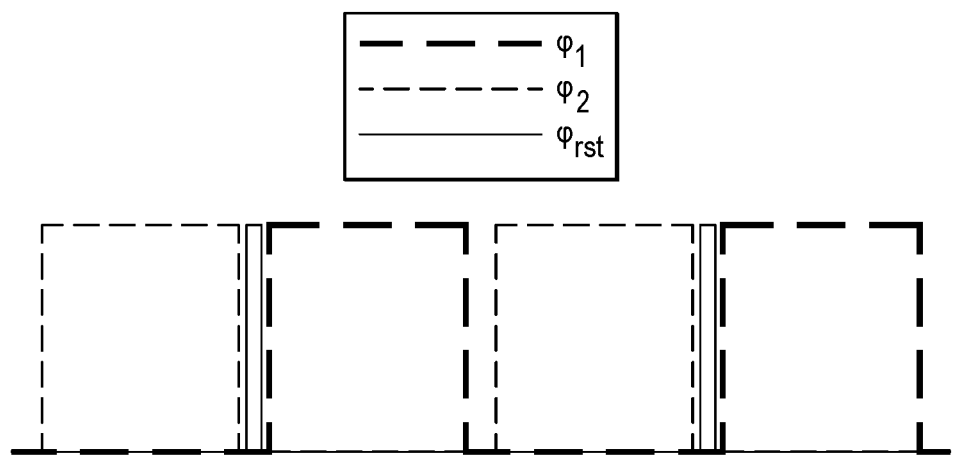
FIG. 4 illustrates a timing diagram of the sampling networks depicted in FIGS. 3A and 3B, in accordance with embodiments of the present disclosure.

Input sampling network 202 may generally operate in accordance with a clock signal having a first phase $\varphi_1$ of a sampling cycle and a second phase $\varphi_2$ of the sampling cycle. In some embodiments, each of first phase $\varphi_1$ and second phase $\varphi_2$ comprise a square-wave signal, for example as shown in FIG. 4. Generally, during first phase $\varphi_1$ of each cycle, switches 208 may close and charges proportional to a differential input voltage $V_{in}=V_{inp}-V_{inn}$ may be sampled onto sampling capacitors 210. During second phase $\varphi_2$ of each cycle, switches 212 may close, and differential input voltage $V_{in}=V_{inp}-V_{inn}$ may be coupled to integrator 206. Consequently the charges sampled onto sampling capacitors 210 during first phase $\varphi_1$ are respectively forced onto integration capacitors 214 during second phase $\varphi_2$ are which are each coupled between inputs and outputs of an operational amplifier 216 of integrator 206. Furthermore, during first phase $\varphi_1$, switches 218 may close to short plates of sampling capacitors 210 to ground and during first phase $\varphi_1$, switches 220 may close to short the opposite plates of sampling capacitors 210 to ground.

Reference sampling network 204 may also operate in accordance with the clock signal having a first phase $\varphi_1$ of a sampling cycle and a second phase $\varphi_2$ of the sampling cycle. Generally, during first phase $\varphi_1$ of each cycle, switches 222 may close and charges proportional to a differential reference voltage $V_{ref}=V_{refp}-V_{refn}$ (e.g., generated by reference generation circuit 104) may be sampled onto reference sampling capacitors 226. During the second phase $\varphi_2$ of each cycle, switches 224 may close, and differential reference voltage $V_{ref}=V_{refp}-V_{refn}$ (e.g., generated by reference generation circuit 104) may be double-sampled (e.g., as shown in FIG. 2) onto reference sampling capacitors 226. Consequently the charges sampled onto sampling capacitors 226 during first phase are respectively forced onto integration capacitors 214.

Figure 3A:
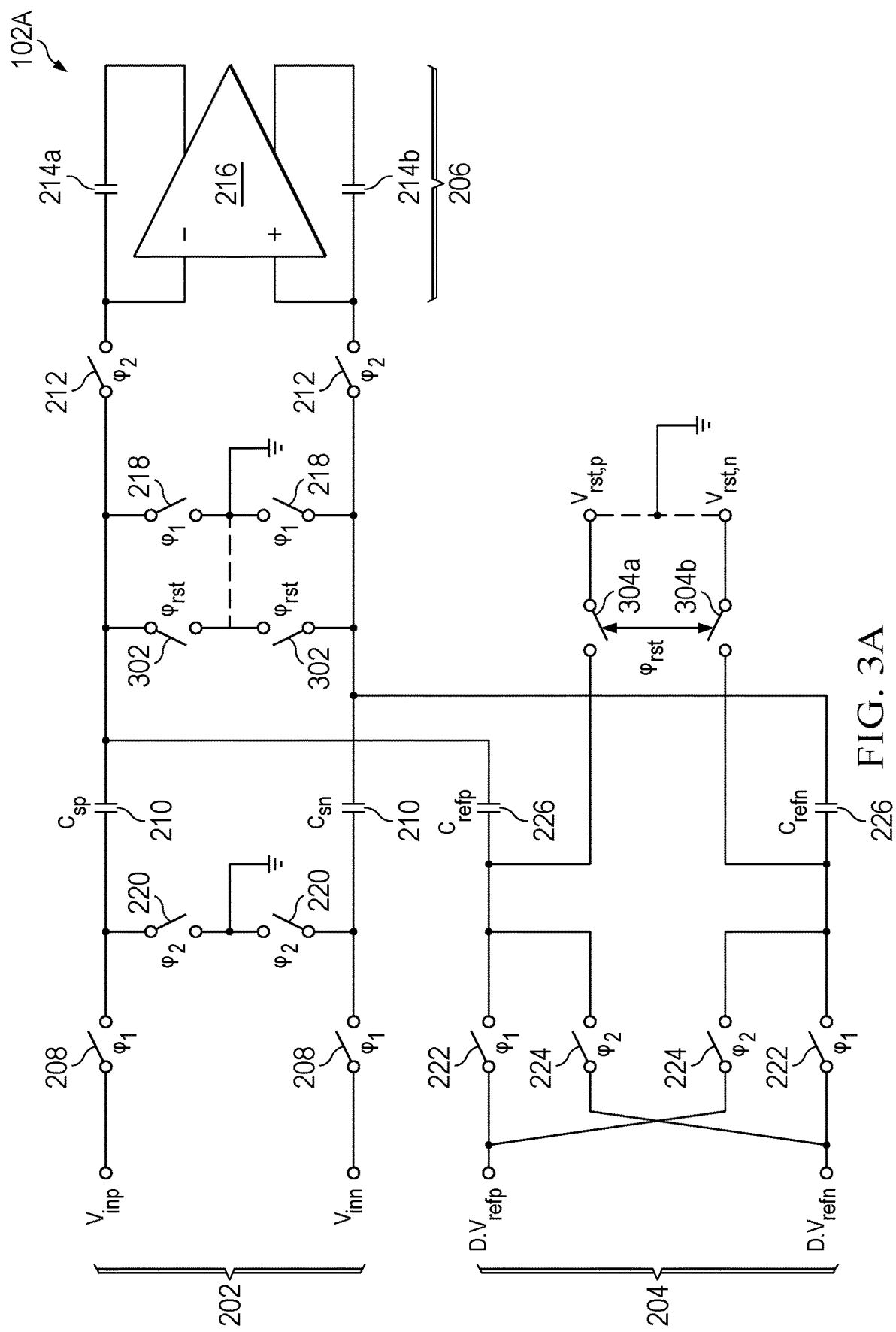
FIG. 3A illustrates a circuit diagram of selected components of an example ADC using a switched-capacitor circuit for double sampling and including reset switches, in accordance with embodiments of the present disclosure.

FIG. 3A illustrates a circuit diagram of selected components of an example ADC 102A using a switched-capacitor circuit for double sampling and including reset switches, in accordance with embodiments of the present disclosure. ADC 102A may be similar in many respects to ADC 102, and thus, only certain differences between ADC 102 and 102A may be described below. As shown in FIG. 3A, reset switches 302 may be arranged to, during a reset phase $\varphi_{rst}$ occurring between first phase $\varphi_1$ and second phase $\varphi_2$ as shown in FIG. 4, short a first terminal of each of sampling capacitors 226 to each other and to ground voltage. Similarly, reset switches 304a and 304b may, during reset phase $\varphi_{rst}$, couple a second terminal of one of sampling capacitors 226 to a reset voltage $v_{rst,p}$ and couple a second terminal of the other of sampling capacitors 226 to a reset voltage $v_{rst,n}$. By performing a discharge of the first terminals of sampling capacitors 226 and a reset on the second terminals of sampling capacitors 226, down-conversion of idle tones at one half the sampling frequency and/or data-dependent signal contents may be reduced or eliminated.

Figure 3B:
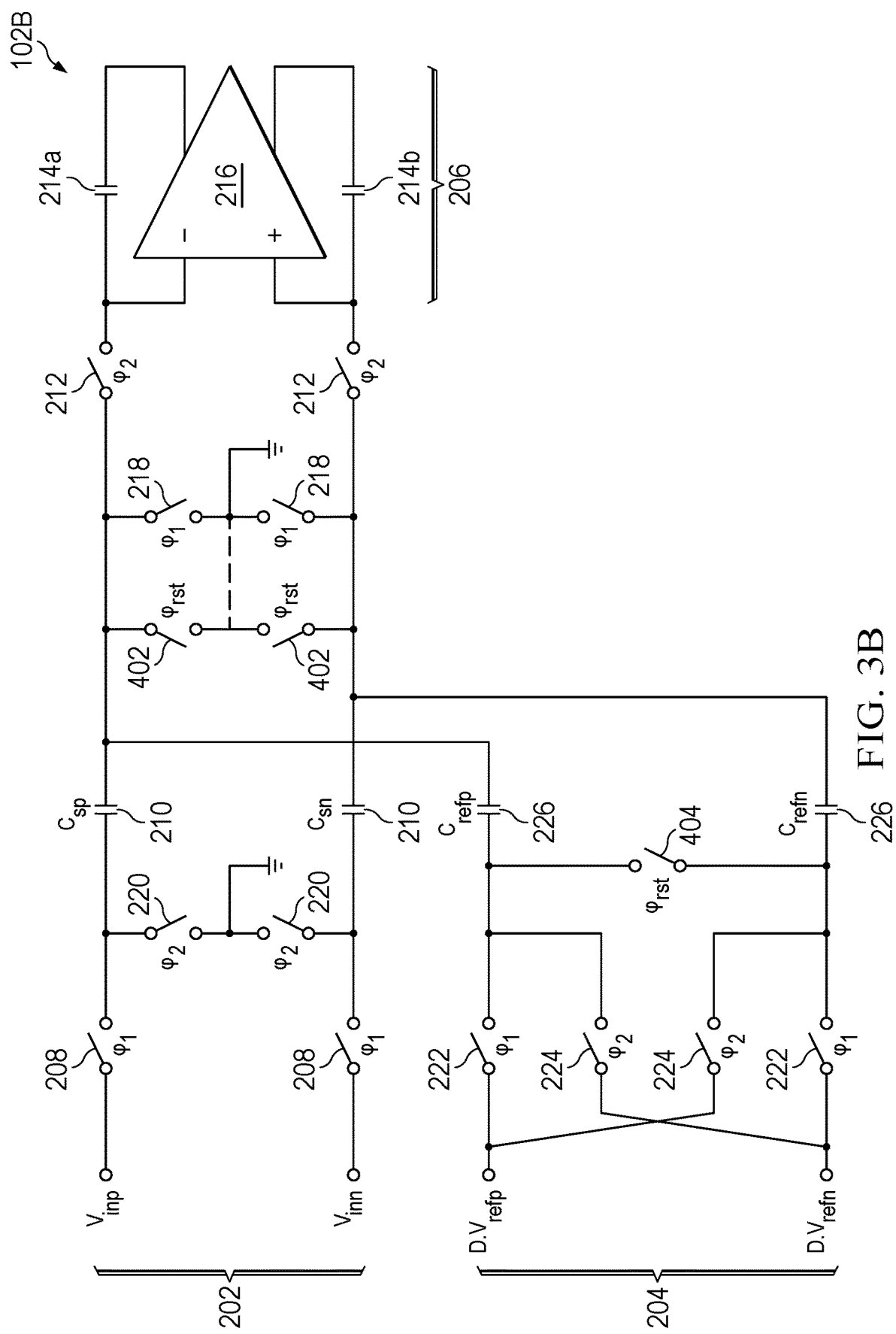
FIG. 3B illustrates a circuit diagram of selected components of another example ADC using a switched-capacitor circuit for double sampling and including reset switches, in accordance with embodiments of the present disclosure.

FIG. 3B illustrates a circuit diagram of selected components of an example ADC 102B using a switched-capacitor circuit for double sampling and including reset switches, in accordance with embodiments of the present disclosure. ADC 102B may be similar in many respects to ADC 102, and thus, only certain differences between ADC 102 and 102B may be described below. As shown in FIG. 3B, reset switches 402 may be arranged to, during a reset phase $\varphi_{rst}$ occurring between first phase $\varphi_1$ and second phase $\varphi_2$ as shown in FIG. 4, short a first terminal of each of sampling capacitors 226 to each other and to ground voltage. Similarly, a reset switch 404 may, during reset phase $\varphi_{rst}$, couple a second terminal of one of sampling capacitors 226 to a reset voltage $v_{rst,p}$ and couple a second terminal of the other of sampling capacitors 226 to a reset voltage $v_{rst,n}$. By performing a discharge of the first terminals and second terminals of sampling capacitors 226, down-conversion of idle tones at one half the sampling frequency and/or data-dependent signal contents may be reduced or eliminated.

In these and other embodiments, the reduction or elimination of data dependency and/or inter-symbol interference may alternatively be done by recharging the capacitors to any data-independent and/or signal-independent voltage or charge during reset phase $\varphi_{rst}$. Such discharging or charging may be performed between any two known data-independent and/or signal-independent voltages across capacitors 210 and/or 226 or by coupling their respective terminals to the same voltage.

Further, proper timing may be required for the discharging or charging during reset phase $\varphi_{rst}$, to ensure no overlap of reset phase $\varphi_{rst}$, with either of first phase $\varphi_1$ and second phase $\varphi_2$.

Figure 5:
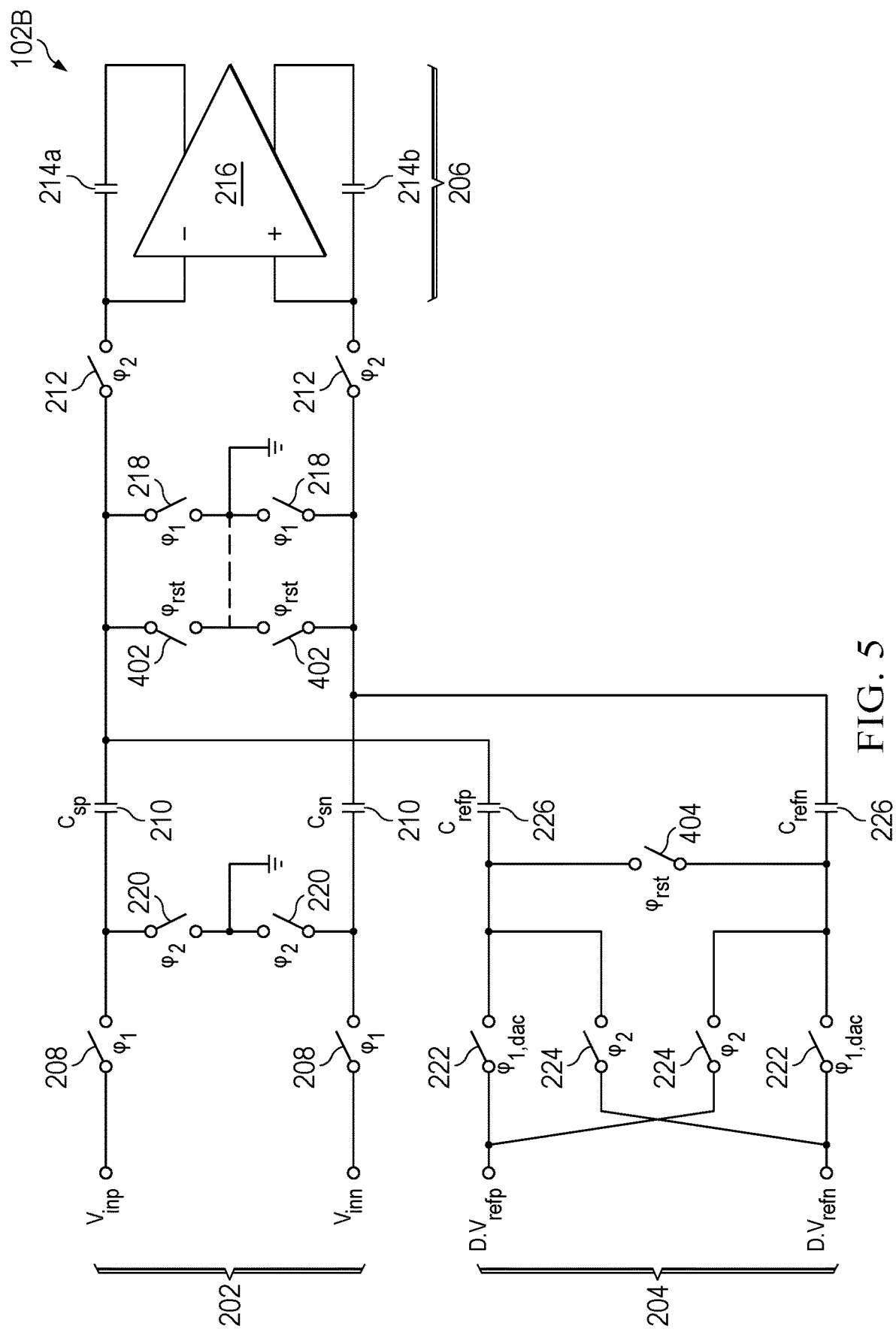
FIG. 5 illustrates a circuit diagram of selected components of an example ADC using a switched-capacitor circuit for double sampling and including reset switches, in accordance with embodiments of the present disclosure.
Figure 6:
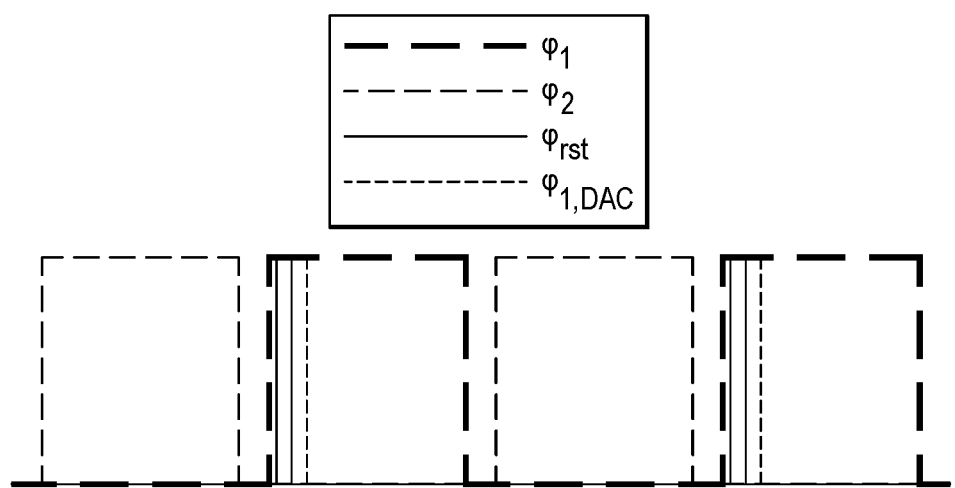
FIG. 6 illustrates a timing diagram of the sampling networks depicted in FIG. 5, in accordance with embodiments of the present disclosure.

Alternatively, as shown in FIGS. 5 and 6, by replacing first phase $\varphi_1$ applied to reference sampling circuit 204 with a digital-to-analog converter (DAC) phase $\varphi_{1,DAC}$ which has a rising edge delayed from first phase $\varphi_1$ (but may have the same falling edge as first phase $\varphi_1$), reset phase $\varphi_{rst}$ may be extended into the beginning of first phase $\varphi_1$ due to no overlap existing between DAC phase $\varphi_{1,DAC}$ and reset phase $\varphi_{rst}$. In some embodiments, the durations of either or both of reset phase $\varphi_{rst}$ and first phase $\varphi_1$ may be made adjustable in order to obtain desired discharge and/or settling times.

Figure 7:
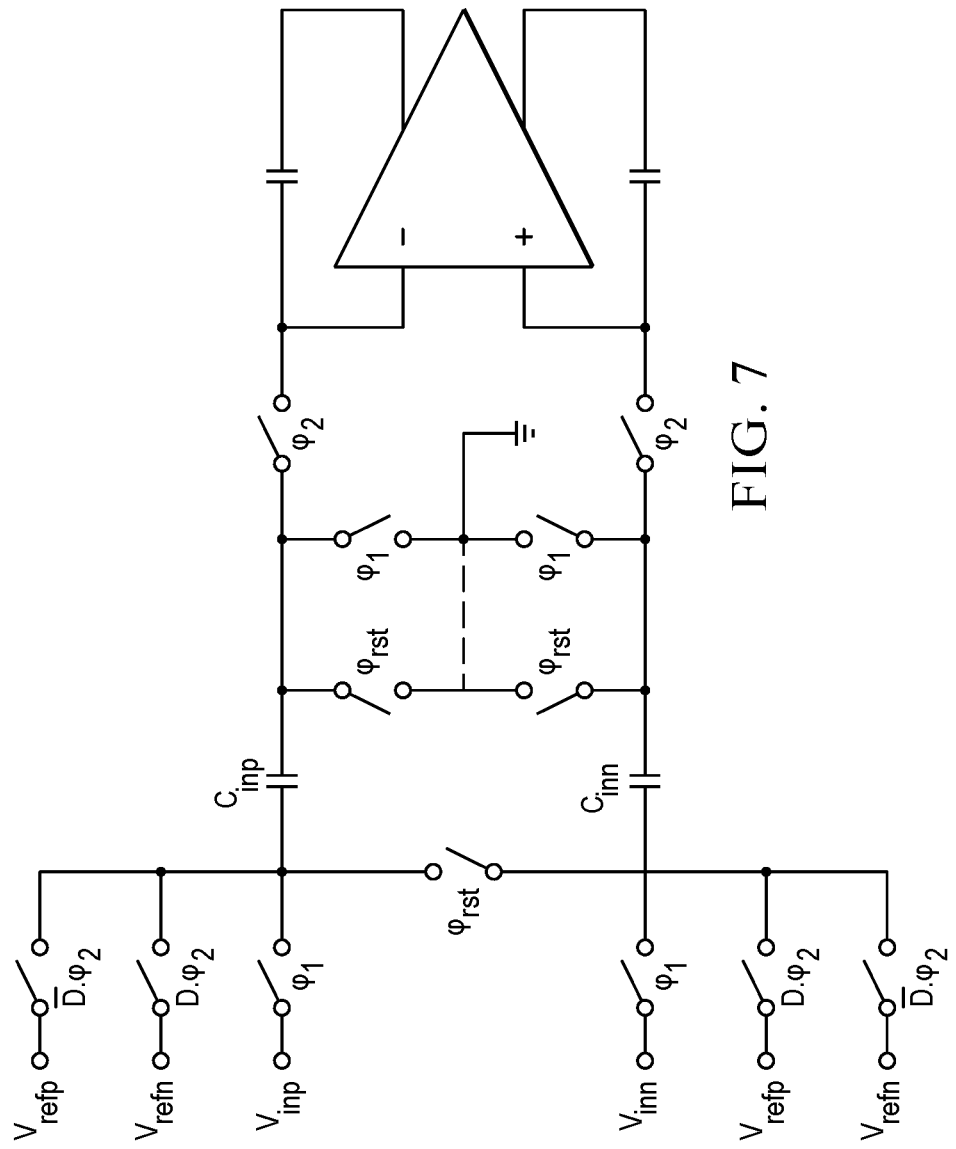
FIG. 7 illustrates a circuit diagram of selected components of an example ADC using a switched-capacitor circuit for single sampling and including reset switches, in accordance with embodiments of the present disclosure.

Although the foregoing contemplates the use of reset schemes in a double-sampled switched-capacitor circuit, a similar scheme may be applied to a single-sampled switched-capacitor circuit, such as shown in FIG. 7. As shown in FIG. 7, one group of sampling capacitors may couple to both input signals and reference voltages, and where at the end of a second phase $\varphi_2$, data-dependent charge may remain on the sampling capacitors and where at the beginning of a first phase $\varphi_1$ the pre-charged sampling capacitors may couple to inputs of and create inter-symbol interference. Accordingly, FIG. 7 may depict a system that implements a switched-capacitor integrator wherein a sampling capacitor is used as a feedback capacitor of a digital-to-analog converter.

Advantageously, the systems and methods disclosed herein may enable a reference sampling, single-sampling, and/or double-sampling scheme with cyclic capacitor discharge wherein all reference sampling capacitors of a plurality of ADCs having a common reference voltage may be discharged at the end of every hold cycle. The systems and methods disclosed herein may also enable a clocking scheme to generate a short pulse (e.g., reset phase $\varphi_{rst}$) during the non-overlap of the sampling clocks, to apply a reset signal to sampling capacitors in order to eliminate kickback and crosstalk between multiple sense channels using a shared weak reference voltage. Further, the systems and methods disclosed herein may enable an inter-symbol interference minimization technique wherein the data-dependent kickback of a switched-capacitor sampler loading a buffer or filter is minimized or eliminated by a cyclic reset phase added to the switched-capacitor operation such that the residual charge on the sampling capacitor is reset before the next sampling or double-sampling cycle.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
a sampling capacitor; and
a switch network comprising:
one or more first sampling switches electrically coupled to the sampling capacitor and configured to be activated during a first phase of a sampling cycle of the system; and
one or more second sampling switches electrically coupled to the sampling capacitor and configured to be activated during a second phase of the sampling cycle, wherein a charge sampled onto the sampling capacitor during the first phase is forced onto an integration capacitor during the second phase; and
wherein the switch network is configured to reset the sampling capacitor to a data-independent and/or signal-independent charge during a reset phase of the sampling cycle.

2. The system of claim 1, wherein the switch network further comprises a reset switch coupled between terminals of the sampling capacitor and configured to discharge the sampling capacitor during the reset phase.

3. The system of claim 1, wherein resetting the sampling capacitor to the data-independent and/or signal-independent charge comprises discharging the sampling capacitor during the reset phase.

4. The system of claim 1, wherein the one or more first sampling switches, the one or more second sampling switches, and the sampling capacitor are arranged to sample a physical quantity onto the capacitor during each of the first phase and the second phase.

5. The system of claim 1, wherein the reset phase is significantly shorter in duration than the first phase and the second phase.

6. The system of claim 1, wherein the system comprises a digital-to-analog converter and the sampling capacitor is a reference capacitor of the digital-to-analog converter.

7. The system of claim 1, wherein the system comprises a switched-capacitor integrator wherein the sampling capacitor is used as a feedback digital-to-analog converter capacitor of a digital-to-analog converter.

8. The system of claim 1, wherein the reset phase occurs after the second phase and before the first phase.

9. The system of claim 1, wherein the reset phase overlaps with one or more of the first phase and the second phase.

10. A method comprising, in a system comprising a sampling capacitor and a switch network comprising one or more first sampling switches electrically coupled to the sampling capacitor and one or more second sampling switches electrically coupled to the sampling capacitor:
   activating the one or more first sampling switches during a first phase of a sampling cycle of the system;
   activating the one or more second sampling switches during a second phase of the sampling cycle, wherein a charge sampled onto the sampling capacitor during the first phase is forced onto an integration capacitor during the second phase; and
   resetting the sampling capacitor to a data-independent and/or signal-independent charge during a reset phase of the sampling cycle.

11. The method of claim 10, wherein resetting the sampling capacitor comprises discharging the sampling capacitor during the reset phase with a reset switch coupled between terminals of the sampling capacitor.

12. The method of claim 10, wherein resetting the sampling capacitor to the data-independent and/or signal-independent charge comprises discharging the sampling capacitor during the reset phase.

13. The method of claim 10, wherein the one or more first sampling switches, the one or more second sampling switches, and the sampling capacitor are arranged to sample a physical quantity onto the capacitor during each of the first phase and the second phase.

14. The method of claim 10, wherein the reset phase is significantly shorter in duration than the first phase and the second phase.

15. The method of claim 10, wherein the system comprises a digital-to-analog converter and the sampling capacitor is a reference capacitor of the digital-to-analog converter.

16. The method of claim 10, wherein the system comprises a switched-capacitor integrator wherein the sampling capacitor is used as a feedback digital-to-analog converter capacitor of a digital-to-analog converter.

17. The method of claim 10, wherein the reset phase occurs after the second phase and before the first phase.

18. The method of claim 10, wherein the reset phase overlaps with one or more of the first phase and the second phase.

* * * * *